United States Patent
Kudo et al.

(10) Patent No.: US 8,318,275 B2
(45) Date of Patent: Nov. 27, 2012

(54) MULTI-COLOR MOLDING ARTICLE, MULTICOLOR MOLDING METHOD AND SUBSTRATE STORAGE CONTAINER

(75) Inventors: Hideo Kudo, Fukushima (JP); Hiroki Yamagishi, Itoigawa (JP)

(73) Assignees: Shin-Etsu Handotai Co., Ltd., Tokyo (JP); Shin-Etsu Polymer Co., Ltd., Tokyo (JP)

( * ) Notice: Subject to any disclaimer, the term of this patent is extended or adjusted under 35 U.S.C. 154(b) by 706 days.

(21) Appl. No.: 12/515,237

(22) PCT Filed: Nov. 14, 2007

(86) PCT No.: PCT/JP2007/072105
§ 371 (c)(1),
(2), (4) Date: May 15, 2009

(87) PCT Pub. No.: WO2008/065892
PCT Pub. Date: Jun. 5, 2008

(65) Prior Publication Data
US 2011/0064896 A1 Mar. 17, 2011

(30) Foreign Application Priority Data
Dec. 1, 2006 (JP) .................. 2006-325096

(51) Int. Cl.
*B65D 81/00* (2006.01)
(52) U.S. Cl. ............. 428/35.7; 428/34.1; 206/454
(58) Field of Classification Search .......... 428/34.1, 428/35.7; 206/454, 455
See application file for complete search history.

(56) References Cited

U.S. PATENT DOCUMENTS

| | | | |
|---|---|---|---|
| 4,874,654 A | 10/1989 | Funaki et al. | |
| 5,584,401 A | 12/1996 | Yoshida | |
| 6,428,729 B1 | 8/2002 | Bhatt et al. | |
| 6,808,668 B2 | 10/2004 | Bhatt et al. | |
| 2003/0025244 A1 | 2/2003 | Bhatt et al. | |
| 2006/0283774 A1* | 12/2006 | Hasegawa et al. | 206/725 |

FOREIGN PATENT DOCUMENTS

| | | |
|---|---|---|
| EP | 1724825 A1 | 11/2006 |
| JP | 63-199818 U | 12/1988 |
| JP | 2000-12673 | 1/2000 |
| JP | 2005-064378 A | 3/2005 |
| JP | 2005-67139 | 3/2005 |
| JP | 2006-324327 A | 11/2006 |

OTHER PUBLICATIONS

Notification of Transmittal of Translation of the International Preliminary Report on Patentability (Chapter I or Chapter II of the Patent Cooperation Treaty) for International Application No. PCT/JP2007/072105, mailed on Jun. 18, 2009 (8 pages).

(Continued)

*Primary Examiner* — Rena Dye
*Assistant Examiner* — Yan Lan
(74) *Attorney, Agent, or Firm* — Osha Liang LLP (57) ABSTRACT

A multicolor molding article is integrally formed of first and second molding materials in combination. At least part of the peripheral portion in the boundary between a first molding part of the first molding material and a second molding part of the second molding material is formed with a thin projected piece. The tapering inclined angle of the thin projected piece is specified to range from 5° to 40°.

12 Claims, 5 Drawing Sheets

OTHER PUBLICATIONS

Patent Abstracts of Japan for Japanese Publication No. 2005-064378, Publication date Mar. 10, 2005 (1 page).
Patent Abstracts of Japan for Japanese Publication No. 2005-067139, Publication date Mar. 17, 2005 (1 page).
International Search Report issued in PCT/JP2007/072105, mailed on Feb. 19, 2008, 2 pages.
Extended European Search Report for Application No. 07831835.9, mailed on May 18, 2012 (6 pages).

* cited by examiner

MULTI-COLOR MOLDING ARTICLE, MULTICOLOR MOLDING METHOD AND SUBSTRATE STORAGE CONTAINER

TECHNICAL FIELD

The present invention relates to a multicolor molding article, a multicolor molding method and a substrate storage container, which use different materials or the same materials in combination to form an one-body structure.

BACKGROUND ART

Conventionally, in mechanical parts of various machinery apparatuses, substrate storage containers and the like, in order to meet the different demanded properties of plural parts that constitute a product, a technique for obtaining a product of different materials by separately forming plural parts from different materials and assembling these plural parts into one-body structure has been adopted. As a manufacturing method of such products, insert molding and multicolor molding (also called two color molding or double molding) can be mentioned. In the multicolor molding process, two materials are selected and used from the viewpoint of whether the two molding materials can be joined or not (see patent documents 1 and 2)

Patent document 1:
    Japanese Patent Application Laid-open 2005-67139
Patent document 2:
    Japanese Patent Application Laid-open 2000-12673

DISCLOSURE OF INVENTION

Problems to be Solved by the Invention

Since, in the conventional multicolor molding method, two materials are used in combination, only from the viewpoint of whether two different molding materials can be joined or not, there is the problem that two kinds of molding materials cannot be suitably used in combination by placing weight on performance. For example, even though a combination of two kinds of molding materials is preferable from a performance viewpoint, if they are not compatible in view of whether they can be joined or not hence they are not a suitable combination, it is impossible to join them successfully. As a result, the combination cannot but be reconsidered.

If two kinds of molding materials are used in combination by placing weight on performance while neglecting the fact of unfavorable combination, the interface between two kinds of molding materials becomes weakened in strength, hence they would peel off due to stress during washing or due to vibration during usage or during transportation.

The present invention has been devised in view of the above, it is therefore an object to provide a multicolor molding article, a multicolor molding method and a substrate storage container, which can use a plurality of molding in suitable combination from a performance viewpoint.

Means for Solving the Problems

In order to solve the above problems, an article of the present invention is integrally formed of first and second molding materials in combination, and is characterized in that at least part of the peripheral portion in the boundary between a first molding part of the first molding material and a second molding part of the second molding material is formed with a thin projected piece, the tapering inclined angle of the thin projected piece being specified to range from 5° to 40°.

Here, the first molding material may be one of polycarbonate, cycloolefin polymer and polyether imide, and the second molding material may be one of polybutylene terephthalate, polypropylene, polyethylene, polyethylene terephthalate, polyacetal and polyether etherketone.

Further, the thin projected piece may be formed to have an approximately triangular section with its inclined surface specified to be 0.4 to 5.0 mm in length.

Also, in order to solve the above problems, a molding method of the present invention is to integrally mold the first and second molding materials in combination, and comprises the steps of: molding a first molding part using the first molding material; and, integrally molding the second molding part with the first molding part, using the second molding material while forming a thin projected piece having an approximately triangular section in at least part of the peripheral portion of the boundary between the first and second molding parts, the tapering inclined angle of the thin projected piece being specified to range from 5° to 40° and its inclined surface specified to be 0.4 to 5.0 mm in length.

Here, the first molding material may be one of polycarbonate, cycloolefin polymer and polyether imide, and the second molding material may be one of polybutylene terephthalate, polypropylene, polyethylene, polyethylene terephthalate, polyacetal and polyether etherketone.

Further, in order to solve the above problems, a container of the present invention includes supporting structures that are disposed on both sides inside a container body for storing substrates and support substrates in array, each supporting structure being formed of the multicolor molding article defined in Claim 1, 2 or 3, and is characterized in that the supporting structure includes a supporting piece formed of the first molding material and positioned on the inner side in the container body and a contact layer formed of the second molding material and integrally laminated (laid over to form a layer) over, at least, the supporting piece to come in contact with the substrate, and, at least part of the peripheral portion of the boundary between the supporting piece and the contact layer is formed with a tapering thin projected piece, the tapering inclined angle of the thin projected piece being specified to range from 5° to 40°.

Here, it is preferred that the supporting structure is formed of the first molding material, arranged on the inner side in the container body, and includes a supporting wall for supporting the supporting pieces.

It is also preferred that an interposed layer made of a material different from the second molding material is formed between the inner side in the container body and the supporting wall of the supporting structure.

It is still preferred that the supporting structure includes the contact layer of the second molding material that is layered over the supporting wall and comes in contact with the substrate at the portion closest to the supporting wall.

Further a project that is in contact with the substrate may be formed on the top surface of the contact layer laminated on the supporting piece of the supporting structure.

Also, the supporting piece of the supporting structure may include a first supporting part that is projected inwards from the inner side in the container body and opposes the side portion of the substrate at a position close to the front end and a second supporting part that is projected inwards from the inner side in the container body and opposes the side portion of the substrate at a position close to the rear end, and the contact layer may be formed over at least the top surface of the exposed areas of the first and second supporting parts.

It is also possible to provide a configuration, wherein the supporting piece of the supporting structure includes a first supporting part that is projected inwards from the supporting wall and opposes the side portion of the substrate at a position close to the front end and a second supporting part that is projected inwards from the supporting wall and opposes the side portion of the substrate at a position close to the rear end, and the contact layer is formed over the exposed areas of the first and second supporting parts while a contact layer is laminated between the supporting wall and the second supporting part, and, at least part of the peripheral portion of the boundary between the supporting wall and the contact layer is formed with a tapering thin projected piece, the tapering inclined angle of the thin projected piece being specified to range from 5° to 40°.

Also, a shelf may be interposed between the first and second supporting parts of the supporting structure.

Further, the top surface of the contact layer laminated on the exposed areas of the first and second supporting parts may be inclined so as to render a circular cone having a center that is approximately concentric with the substrate.

Still more, at least part of the peripheral portion of the boundary between the supporting wall and the contact layer may be formed with a tapering thin projected piece, the tapering inclined angle of the thin projected piece being specified to range from 5° to 40°.

Moreover, in order to solve the above problems, a container of the present invention includes supporting structures that are disposed on both inner sides in a container body for storing substrates and support substrates in array, each supporting structure being formed of the multicolor molding article defined in Claim 1, 2 or 3, and is characterized in that the supporting structure includes a supporting wall formed of the first molding material and positioned on the inner side in the container body and a supporting piece molded of the second molding material on the supporting wall to come in contact with and support the substrate, and at least part of the peripheral portion of the boundary between the supporting wall and the supporting piece is formed with a tapering thin projected piece, the tapering inclined angle of the thin projected piece being specified to range from 5° to 40°.

Here, the supporting piece of the supporting structure may preferably include a first supporting part that is projected inwards from the supporting wall and opposes the side portion of the substrate at a position close to the front end and a second supporting part that is projected inwards from the supporting wall and opposes the side portion of the substrate at a position close to the rear end.

Herein, the first and second molding materials in the claims may be either the same materials or different materials. The multicolor molding articles may, at least, include various kind of buttons, key top, knobs for various machines, tweezers, automobile-related products (driver's seat illumination parts etc.), lens hoods for cameras, grips for digital cameras, control part for mobile phones, part of substrate storage containers for storing various kinds of substrates such as glass substrates, semiconductor wafers etc., wafer trays, substrate handling jigs. When the multicolor molding article is part of a substrate storage container, it does not matter whether it is part of a top open box type, front open box type or bottom open box type.

It does not matter whether the first and second molding parts are singular or plural. The thin projected piece may be either part of the peripheral portion of the boundary between the first and second molding parts, or part of the peripheral portion and its interior side. Also, it may be the whole part of the peripheral portion in the boundary between the first and second molding parts. This thin projected piece is preferably formed in an approximately triangular shape, specifically, in the form of a right triangle or a shape that is regarded as an approximately right triangle. Further, the first and second supporting parts are preferably positioned apart from each other.

According to the present invention, when a multicolor molding article is formed, it is possible to obtain a multicolor molding article of different materials or of the same materials by molding the first molding part to be the primary side of the first molding material, setting it in the mold for forming the second molding part, charging the second molding material into this mold to form the second molding part to be the secondary side, and forming, at least, part of the peripheral portion in the boundary between the first and second molding parts into thin projected piece and fusing (melting with heat) it to join.

Effect of the Invention

The present invention has the effect that a plurality of molding materials, in particular, plural kinds of different molding materials can be suitably used in combination in view of performance. Further, since the tapering inclined angle of the thin projected piece is specified to be within the range of 5° to 40°, the molding material can be filled into the front end of the thin projected piece, it is hence possible to join the first and second molding parts firmly.

Further, when thin projected piece is formed to have an approximately triangular section with its inclined surface specified to be 0.4 to 5.0 mm long, excellent joining can be expected. In addition it is possible to charge the molding material sufficiently and stabilize molding.

Further, when the supporting structure includes a contact layer that is formed with the supporting wall and comes into contact with the substrate at its closest portion to the supporting wall, the contact layer comes into contact with the substrate at its close portions to the supporting walls when the substrate is taken in and out, and it is hence possible to prevent abrasion and damage accompanied by contact between the substrate and the supporting walls.

Further, when the top surface of the contact layer laminated on the exposed areas of the first and second supporting parts is inclined so as to render a circular cone having a center that is approximately concentric with the substrate, the substrate is automatically centralized due to gravity when the substrate storage container is of a front open box type and the substrates are stored and supported horizontally. Accordingly, it is possible to position the substrate correctly. Further, since a force that centralizes the substrate toward the center acts on and constrains the substrate at any time, this configuration has the effect that rotation of the substrate can be limited.

Figure 1:
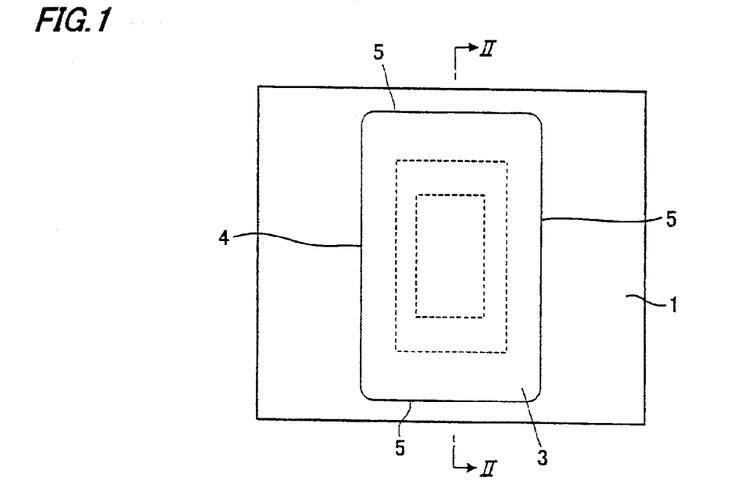
[FIG. 1] is an illustrative view schematically showing an embodiment of a multicolor molding article and multicolor molding method according to the present invention.

DESCRIPTION OF REFERENCE NUMERALS 1 first molding part
3 second molding part
5 thin projected piece
6 boundary
7 inclined surface
10 container body
20 door
30 supporting structure
31 supporting wall
32 front part
33 rear part
34 supporting piece
35 first supporting part
36 second supporting part
37 contact layer
38 top surface
39 stepped portion
40 contact layer
50 projection
51 interposed coating layer (interposed layer)
52 shelf
W substrate
Wa closest position Best Mode For Carrying Out The Invention Now, preferred embodied modes of the present invention will be described with reference to the drawings. In a multicolor molding article and multicolor molding method in the present embodiment, as shown in FIGS. 1 to 3, when preparing first and second molding materials different in material properties from each other and combining and integrating a pair of first molding parts 1 of the first molding material with a second molding part 3 of the second molding material, the peripheral portion in a linear boundary 6 between each first molding part 1 and second molding part 3 is formed with an acute-angled thin projected piece 5 having an approximately triangular section.

Though not particularly limited, various kinds of thermoplastic resins are used for the first molding material; specifically, polycarbonate, cycloolefin polymer or polyether imide or the like may be selected. Also, the second molding material is not particularly limited, but for example, various kinds of thermoplastic resins, which are more excellent in sliding performance, heat-resistance and wear resistance than the first molding material and difficult to be fused (melted with heat) with the first molding material, are used; specifically, polybutylene terephthalate, polypropylene, polyethylene, polyethylene terephthalate, polyacetal, polyether etherketone or the like may be selected.

Figure 2:
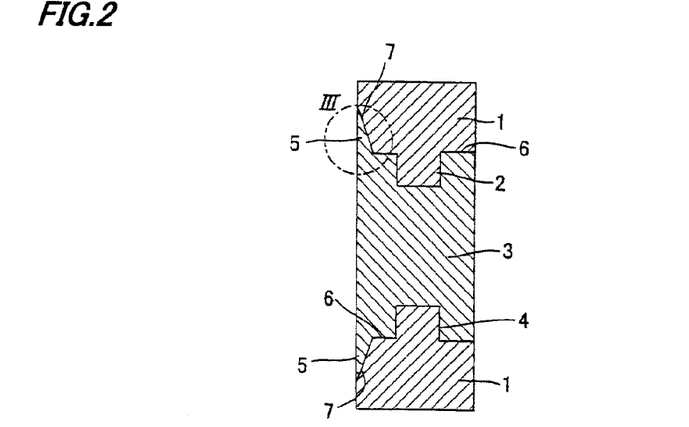
[FIG. 2] is a sectional illustrative view cut along a line II-II in FIG. 1.
Figure 3:
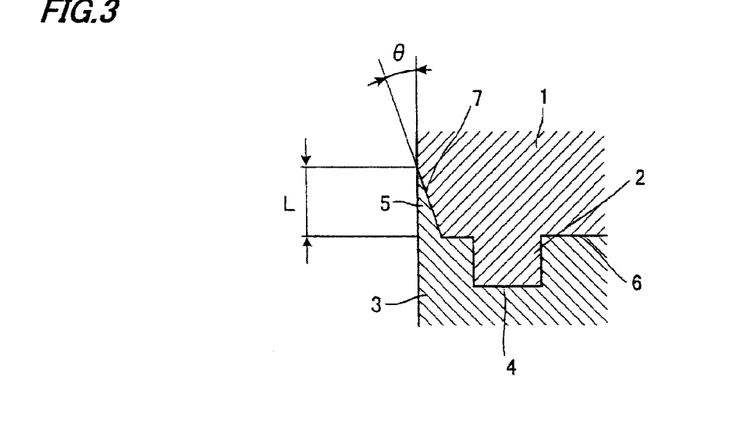
[FIG. 3] is an enlarged sectional illustrative view schematically showing a part III in FIG. 2.

As shown in FIGS. 2 and 3, the paired first molding parts 1 are formed into approximately block shapes having equally sized sections and function to hold second molding part 3 therebetween. In the interface of each first molding part 1 in contact with second molding part 3, a projected portion 2 to be fitted to second molding part 3 is projectively formed. Further, as shown in FIGS. 2 and 3, second molding part 3 is formed into a block shape having a section longer than first molding part 1 and its interface in contact with each first molding part 1 is hollowed with a depressed portion 4 that mates with projected portion 2 of first molding part 1.

As shown in the same drawings, thin projected piece 5 is formed in a shape having an approximately right triangular section (also a wedge-like section) that becomes thinner toward the distal end, and the tapering inclined angle θ formed between an inclined surface 7 that forms boundary 6 and the horizontal surface is specified to range from 5° to 40°, preferably 10° to 30°, and more preferably 15° to 20° while the length L of inclined surface 7 is specified to range from 0.4 to 5.0 mm.

The reason why the tapering inclined angle θ of thin projected piece 5 is specified within the range of 5° to 40° is that if the inclined angle θ is less than 5°, the front end part of thin projected piece 5 cannot be sufficiently filled with the first and second molding materials from experimental results. In contrast, if inclined angle θ exceeds 40°, it is impossible to form robust joining between each first molding part 1 and second molding part 3 from experimental results. The inclined angle θ of tapering thin projected piece 5 ranging from 10° to 30° is the most suitable in view of multicolor molding stability and joint reliability.

The reason why the length L of inclined surface 7 of thin projected piece 5 is specified within the range of 0.4 to 5.0 mm is that if the length L is less than 0.4 mm, sufficient joining cannot be expected from experimental results. In contrast when the length L exceeds 5.0 mm, it is impossible to fill the first and second molding materials properly from experimental results, making molding unstable.

In the above, when multicolor molding articles such as mechanical parts of various machinery equipment, buttons, key top, knobs, tweezers and the like are molded, first, the first molding material made of plasticized polycarbonate or the like is charged into an unillustrated mold so as to from a pair of first molding parts 1 to be the base. Then, each first molding part 1 is separated from the mold and inserted into a mold (not shown) for forming second molding part 3, so as to section part of the cavity wall surface of the mold by each first molding part 1.

After a pair of first molding parts 1 have been inserted in the mold for the second molding part, the second molding material made of plasticized polybutylene terephthalate or the like is charged into the mold so as to form second molding part 3 while forming acute-angled thin projected piece 5 in the peripheral portion of boundary 6 between each first molding part 1 and second molding part 3 for joining in fusion. Thereafter, the product is cooled and dismounted from the mold so as to complete a multicolor molding article.

According to the above configuration, even when the combination of the first and second molding materials are unfavorable in view of joining, the peripheral portions of boundaries 6 between first and second molding parts 1 and 3 are integrated by forming thin projected pieces 5 so that it is possible to combine properly and firmly without using high pressure and/or heat. As a result, there is no need of reconsidering the combination from the viewpoint of joining. Accordingly, it is possible to select a suitable combination of two kinds of molding materials, placing weight on performance, even though the two are poor in compatibility. Further, it is possible to reliably prevent the interface between two kinds of molding materials from weakening in strength and the materials from peeling off due to stress during washing or due to vibration during usage and during transportation.

Next, a substrate storage container using the above multicolor molding articles or multicolor molding method will be described. A substrate storage container of the present embodiment includes: as shown in FIGS. 4 to 11, a container body 10 for accommodating a plurality of substrates W, or round semiconductor wafers of 300 mm in diameter; and a door 20 to open and close the open front of the container body 10 with a sealing gasket 24 interposed therebetween. A pair of supporting structures 30 for supporting plural substrates W in array are disposed on the opposing side walls of container body 10, each supporting structure 30 being formed of a multicolor molding article.

The molding material for container body 10 and door 20 is not particularly limited, but is preferably selected from thermoplastic resins such as, for example polycarbonate, polyether imide, cycloolefin resins etc.

Figure 4:
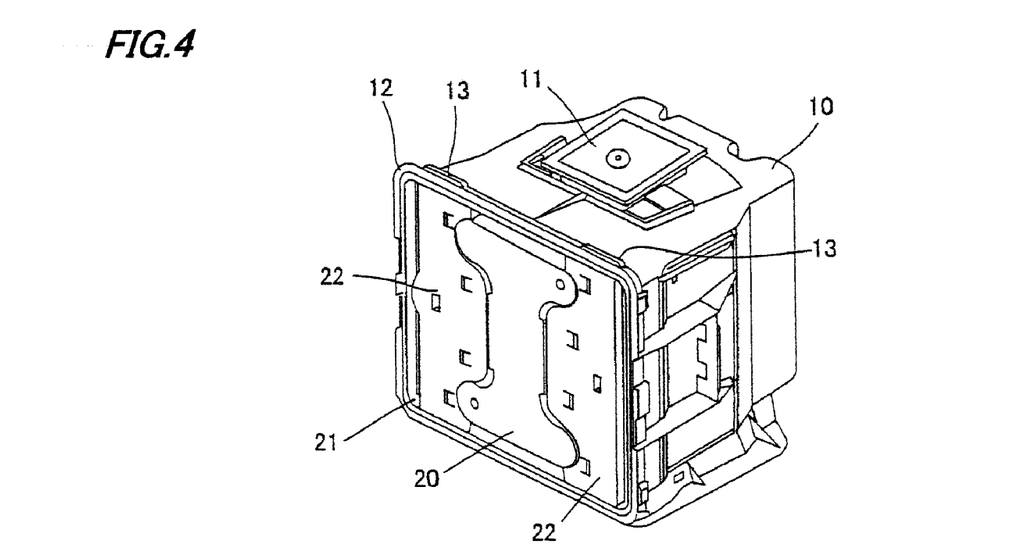
[FIG. 4] is an overall perspective illustrative view schematically showing an embodiment of a substrate storage container according to the present invention.
Figure 5:
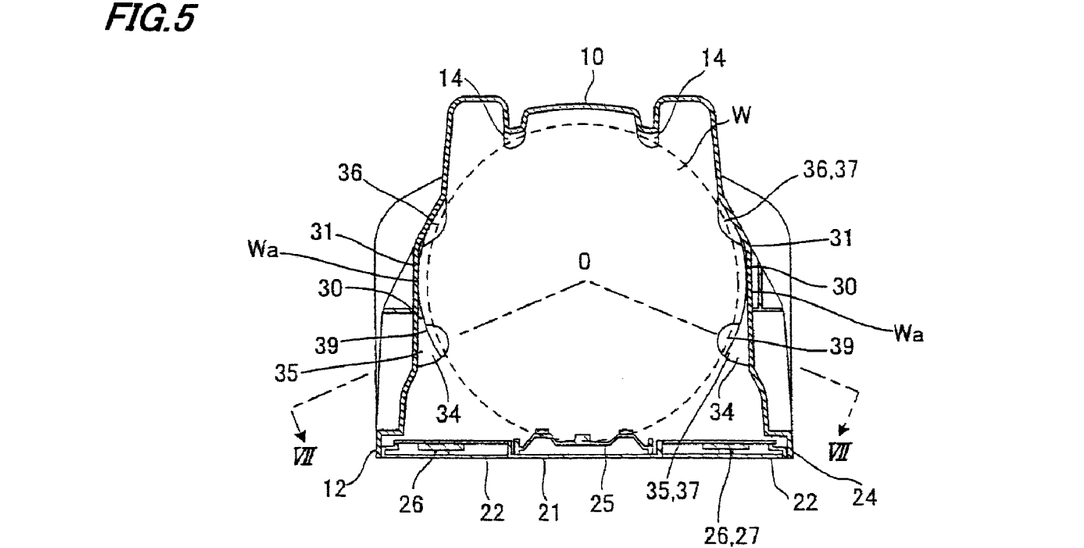
[FIG. 5] is a sectional illustrative view schematically showing an embodiment of a substrate storage container according to the present invention.

As shown in FIGS. 4 and 5, container body 10 is formed of, for example transparent polycarbonate or the like, in a front open box type having an opening on the front side. Formed on the underside at both sides on the front side and at the center in the rear are positioning jigs having an approximately inverted V-shaped section, which are to be fitted from above into positioning pins of unillustrated semiconductor processing equipment. Attached to the top center is a removable robotic handle 11 to be held by an unillustrated automaton.

The front side of container body 10 is formed with a rim portion 12 for fitting door 20, which is swelled sidewards and outwards. A plurality of engagement holes 13 for locking mechanisms 26 of door 20 are hollowed and positioned apart at top and bottom on the inner peripheral surface of the rim portion 12. Further, on the interior rear wall of container body 10, plural pairs of left and right rear retainers 14 for horizontally fitting and holding substrates W at their rear periphery are arranged from top to bottom with a predetermined pitch. Also, hand carriage handles (not shown) are removably attached to the both exterior side walls of container body 10.

As shown in FIGS. 4 and 5, door 20 is comprised of a casing 21 having a laterally long approximately rectangular shape in front view, removably fitted to rim portion 12 of the container body front and a plurality of cover plates 22 having approximately rectangular shapes for removably covering the open front in both sides of the casing 12. Incorporated between these casing 21 and plural cover plates 22 are a pair of left and right locking mechanisms 26 that are engaged with engagement holes 13 of container body 10 to lock.

Casing 21 is formed so as to have an approximately dish-like section and has a frame-like stepped hollow 23 cut out around the periphery on the rear side thereof that opposes substrates W. Elastic endless sealing gasket 24 is fitted in this stepped hollow 23. This sealing gasket 24 is pressed and deformed inside rim portion 12 of container body 10 to assure air tightness. Attached in the hollowed center in the rear side of this casing 21 is a removable vertically long front retainer 25 that elastically holds plural substrates W horizontally at their front side periphery.

Each locking mechanism 26 includes a rotary plate 27 that is axled on the front side of casing 21 so as to be operated from the outside. A pair of top and bottom advancing/retracting plates that slide vertically outwards and inwards of casing 21 as rotary plate 27 rotates are coupled with the peripheral part of rotary plate 27 by means of arc-shaped slots, pins and the like. An engaging claw that passes through the peripheral wall of casing 21 to fit into engagement hole 13 of container body 10 is swayably coupled and supported at the distal end of each advancing/retracting plate.

A pair of supporting structures 30 are formed on both side walls by insert molding when container body 10 is molded, and function to array plural substrates W stored in container body 10 with a predetermined pitch in the vertically direction by horizontally supporting each substrate W at both left and right sides. As shown in FIGS. 6 to 11, each supporting structure 30 is formed including a supporting wall 31 integrated with the side wall of container body 10, a plurality of supporting pieces 34 arrayed vertically on supporting wall 31 with a predetermined pitch, plural sections of a contact layer 37 laminated on the exposed area of part of supporting wall 31 and each supporting piece 34 and plural sections of a contact layer 40 formed on each supporting wall 31.

Figure 9:
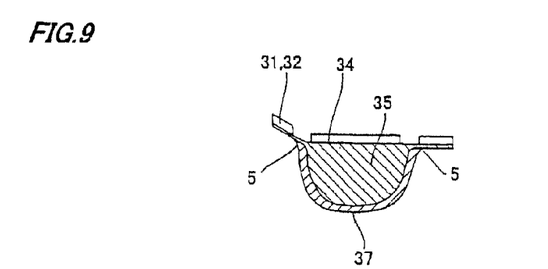
[FIG. 9] is a sectional illustrative view cut along a line IX-IX in FIG. 8.
Figure 10:
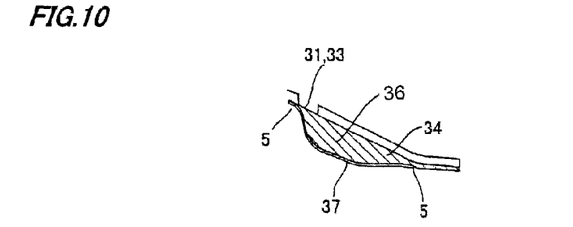
[FIG. 10] is a sectional illustrative view cut along a line X-X in FIG. 8.
Figure 11:
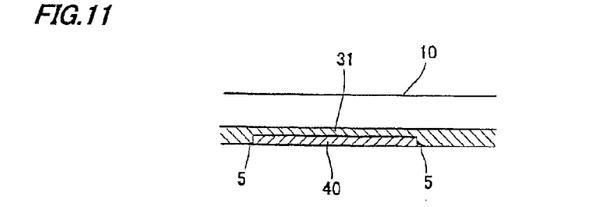
[FIG. 11] is a sectional illustrative view cut along a line XI-XI in FIG. 8.

In the thus constructed supporting structure 30, as shown in FIGS. 9 to 11, the peripheral portions of boundary 6 between part of supporting wall 31 and contact layer 37, of boundary 6 between each supporting piece 34 and contact layer 37 and of boundary 6 between supporting wall 31 and each contact layer 40 are each formed with tapering thin projected piece 5, and the tapering inclined angle $\theta$ of each thin projected piece 5 is specified to range from 5° to 40°, preferably 10° to 30°, and more preferably 15° to 20° while the length L of inclined surface 7 forming boundary 6 is specified to range from 0.4 to 5.0 mm.

Supporting wall 31 and plural supporting pieces 34 are molded of the first molding material made of polycarbonate or the like which is excellent in impact resistance, heat resistance and water resistance while plural sections of contact layer 37 and contact layer 40 are molded of the second molding material made of polybutylene terephthalate or the like which has surface smoothness, low abrasiveness and dimensional stability. Accordingly, supporting wall 31 and plural supporting pieces 34 form first molding part 1, and plural sections of contact layer 37 and contact layer 40 form second molding part 3.

Supporting walls 31 are formed in a vertically long rectangular shape when viewed from front, and integrated by insert molding with the inner surface of the side walls when container body 10 is molded. The rear part 33 (the right side in FIGS. 6 and 8) of this supporting wall 31 is bent and inclined inwards of container body 10 with an inclined angle of 45° to 80°, so as to correspond to the shape of the rear part of the side wall of container body 10 that is curved inwards.

Figure 8:
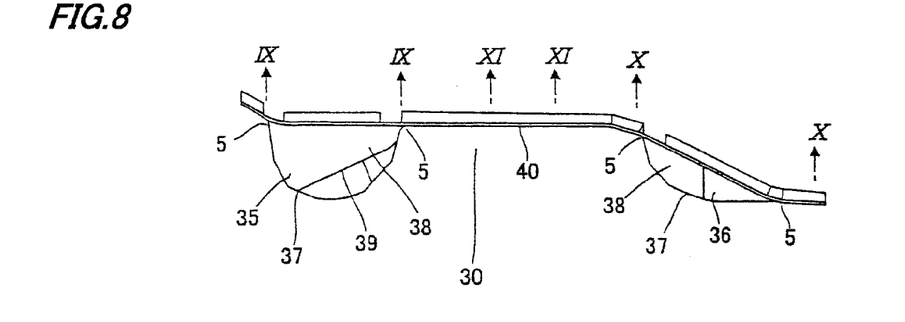
[FIG. 8] is a plan illustrative view schematically showing a supporting structure in an embodiment of a substrate storage container according to the present invention.

As shown in FIGS. 5 and 8, each supporting piece 34 is separately formed of a first supporting part 35 that is approximately horizontally projected inwards of container body 10 from the surface in a front part 32 of supporting wall 31 to oppose substrate W around the forward end of the side part (front end of the side part) from below through contact layer 37 and a second supporting part 36 that is approximately horizontally projected inwards of container body 10 from the surface in bent rear part 33 of supporting wall 31 to oppose substrate W around the tail end of the side part (rear end of the side part) from below through contact layer 37. These first and second supporting parts 35 and 36 are arranged apart in the front-to-rear direction of container body 10, or in the direction in which substrate W is put in and taken out.

Figure 6:
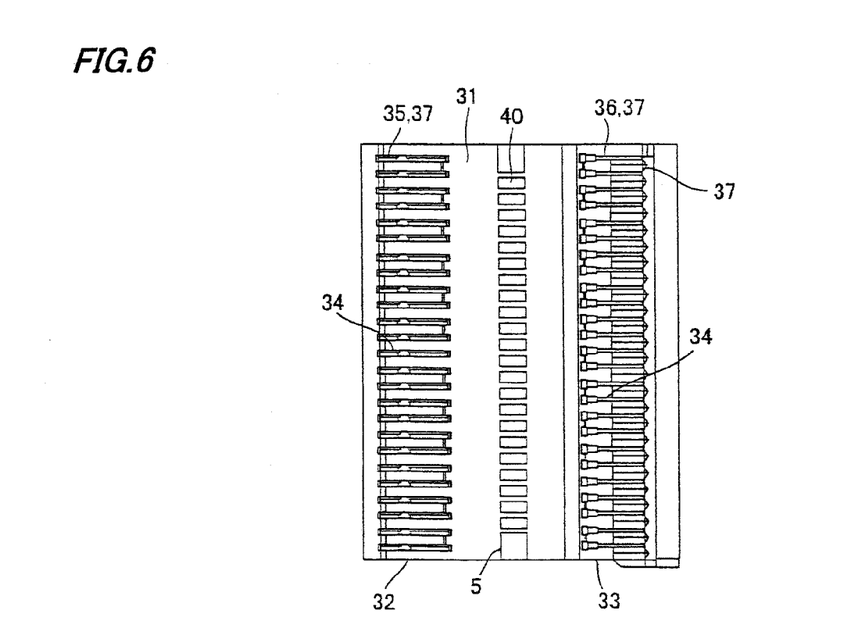
[FIG. 6] is a front illustrative view schematically showing a supporting structure in an embodiment of a substrate storage container according to the present invention.
Figure 7:
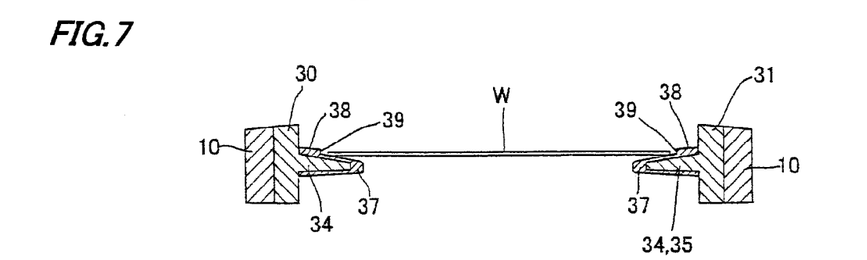
[FIG. 7] is a sectional illustrative view cut along a line VII-VII in FIG. 5.

As shown in FIG. 7, first supporting part 35 has an approximately semi-circular form, when viewed from top, having an approximately tapering section gradually thinner toward the distal end, and is positioned on the front side of container body 10 and covered with contact layer 37, so that its thin front end part opposes the underside of substrate W at a position close to the front end from below through contact layer 37. On the other hand, second supporting part 36 has a polygonal form smaller and narrower than first supporting part 35, having an approximately tapering section gradually thinner toward the distal end, and is positioned on the rear side of container body 10 and covered with contact layer 37, this contact layer 37 partly covering the rear part 33 surface of supporting wall 31 (see FIG. 6).

As shown in FIGS. 7, 9 and 10, plural sections of contact layer 37 are integrally laminated over the exposed areas of first and second supporting parts 35 and 36 and also over the rear part 33 surface of supporting wall 31 between plural second supporting parts 36 that are arranged vertically, in such a manner that the peripheral portions of boundaries 6 with first and second supporting parts 35 and 36 and the rear part 33 surface of supporting wall 31 are each formed with tapering thin projected piece 5, wherein the tapering inclined angle θ of each thin projected piece 5 is specified to range from 5° to 40°, preferably 10° to 30°, and more preferably 15° to 20° while the length L of inclined surface 7 forming boundary 6 is adjusted to range from 0.4 to 5.0 mm.

Contact layer 37 covering first and second supporting parts 35 and 36 is formed to have an approximately tapering hollowed section with a top surface 38 gradually inclined downward toward the distal end so as to support side periphery of substrate W. The thus formed top surface 38 of contact layer 37 is formed with such an inclination as to render an inverted circular cone that is concentric with the center of substrate W, as shown in FIG. 7, and functions to position substrate W utilizing its weight and restrict substrate W from rotating.

As shown in the same figure, a stepped portion 39 is formed in the thickness direction in top surface 38 of contact layer 37 that covers first supporting part 35. This stepped portion 39 comes into contact with the side periphery of substrate W so as to restrain the substrate from popping out toward the open front of container body 10. This stepped portion 39 is formed as high as the thickness dimension of substrate W, specifically 0.3 mm to 0.7 mm.

As shown in FIG. 6, plural sections of contact layer 40 are arrayed vertically with a predetermined pitch in the approximate center on the surface of each supporting wall 31 and positioned between first and second supporting parts 35 and 36 so as to come into contact with substrate W when it is taken in and out at its closest positions Wa to supporting walls 31 on both sides, thereby preventing abrasion and damage accompanied by contact of substrate W with supporting walls 31.

As shown in FIGS. 6 and 11, each contact layer 40 is formed in a laterally long or vertically long rectangular shape when viewed from front with its peripheral portion of boundary 6 with the surface of supporting wall 31 formed with tapering thin projected piece 5. The tapering inclined angle θ of each thin projected piece 5 is specified to range from 5° to 40°, preferably 10° to 30°, and more preferably 15° to 20° while the length L of inclined surface 7 forming boundary 6 is adjusted to range from 0.4 to 5.0 mm. Other portions are the same as in the above embodiment, so that description is omitted.

In the above, when container body 10 and supporting structures 30 are produced, first, supporting wall 31 of supporting structure 30 and plural supporting pieces 34 to be the base are integrally molded of the plasticized first molding material to form an intermediate article. This intermediate article is set in a mold (not shown) for molding plural sections of contact layer 37 and contact layer 40, and the plasticized second molding material is charged into this mold to form plural sections of contact layer 37 and contact layer 40, forming a complete supporting structure 30.

During this molding, the peripheral portions of boundary 6 of supporting wall 31 with contact layer 37, boundary 6 of each of first and second supporting parts 35 and 36 with contact layer 37 and boundary 6 of supporting wall 31 with each contact layer 40 are each formed with tapering thin projected piece 5, wherein the tapering inclined angle θ of each thin projected piece 5 is specified to range from 5° to 40° while the length L of inclined surface 7 forming boundary 6 is set to range from 0.4 to 5.0 mm, it is hence possible to expect favorable fusing and joining without regard to the compatibility of the first and second molding materials. Accordingly, it is possible to form strong integration of supporting wall 31 with contact layer 37, of first and second supporting parts 35 and 36 with contact layer 37 and of supporting wall 31 with contact layer 40, without using high pressure and/or heat.

Thus, a molding of supporting structure 30 is completed, and this supporting structure 30 is inserted into a mold (not shown) for molding container body 10. Then, the molding material for container body 10 is charged into this mold. Thereafter, the product is cooled and dismounted from the mold so as to complete container body 10 including supporting structures 30 on both the left and right sides.

According to the above configuration, even when the first and second molding materials are unfavorable for combination (e.g., combination of polycarbonate and polybutylene terephthalate, etc.) in view of joining, the peripheral portions of boundary 6 between supporting wall 31 and contact layer 37 and boundary 6 between each supporting piece 34 and contact layer 37 are each integrated by forming thin projected piece 5 so that it is possible to join properly and firmly. As a result, it is no longer necessary to reconsider the combination from the viewpoint of joining. Accordingly, it is possible to use two kinds of molding materials in combination properly, placing weight on performance, even though the two are poor in compatibility, hence it is possible to definitely meet different demanded properties of plural portions of supporting structure 30.

Also, it is possible to reliably inhibit and prevent the interface between two kinds of molding materials from weakening in strength and the materials from peeling off from immersion of a surfactant and stress during washing or from vibration during usage and transportation. Further, since not only part of the periphery of boundary 6 is formed with tapering thin projected piece 5 but the whole periphery of boundary 6 is formed with tapering thin projected piece 5, a markedly high strength can be obtained.

Further, since not the exposed area of supporting piece 34 but the inclined top surface 38 of contact layer 37 which is high in sliding performance will be in contact with substrate W, very smooth movement of substrate W can be expected without producing any trace at the positions of placement on substrate W. Accordingly, it is possible to prevent substrate W from being taken out incorrectly, hence prevent trouble and positively prevent substrate W from being marked and scratched. Moreover, since first and second supporting parts 35 and 36 are not formed of a one-piece plate, but are separated and arranged apart from each other, it is possible to lessen the contact area with substrate W, hence markedly reduce generation of particles.

Figure 12:
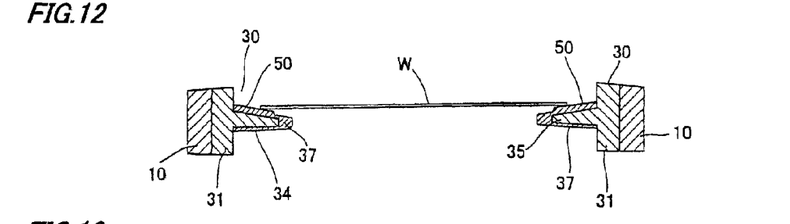
[FIG. 12] is a sectional illustrative view schematically showing the second embodiment of a substrate storage container according to the present invention.

Next, FIG. 12 shows the second embodiment of the present invention. In this case, a projection 50 that comes in contact with the peripheral part on the undersurface of substrate W is formed on the top surface 38 of either the contact layer 37 that covers first supporting part 35 of each supporting structure 30 or the contact layer 37 that covers second supporting part 36.

In FIG. 12, projections 50 that come in contact with the peripheral part on the undersurface of substrate W are formed on top surface 38 of the contact layer 37 that covers first supporting parts 35 on both left and right sides. Instead of this, projections 50 that come in contact with the peripheral part on the undersurface of substrate W may be formed on top surface 38 of the contact layer 37 that covers each of second supporting parts 36.

Projection 50 maybe, for example an elongated linear piece that is integrated with top surface 38 of contact layer 37 and oriented in the radial direction of substrate W. Other portions are the same as in the above embodiment, so that description is omitted.

Also in the present embodiment, the same operational effect as in the above embodiment can be expected. In addition, since projections 50 of a small area come into contact with the undersurface of substrate W, it is obvious that the possibility of generation of particles can be markedly reduced by reducing the contact area.

Figure 13:
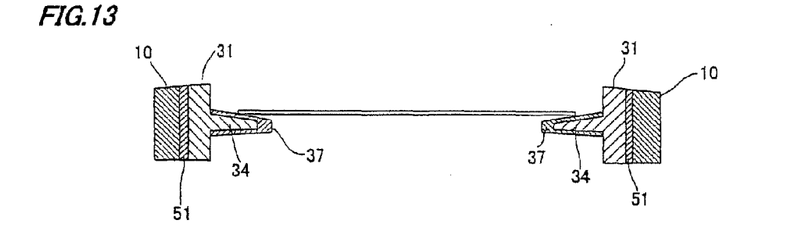
[FIG. 13] is a sectional illustrative view schematically showing the third embodiment of a substrate storage container according to the present invention.

Next, FIG. 13 shows the third embodiment of the present invention. In this case, an interposed covering layer 51 of a material at least different from the second molding material is formed plate-like and integrated between each side wall of container body 10 and supporting wall 31 of each supporting structure 30.

Each interposed covering layer 51 is thin molded of a molding material other than the second molding material, for example the first molding material or any other molding material. Other portions are the same as in the above embodiment, so that description is omitted.

Also in the present embodiment, the same operational effect as in the above embodiment can be expected. In addition, it is obvious that the structure can be integrated with the side wall of container body 10 after the second molding material is made not to be exposed to the exposed area of the first molding material.

Figure 14:
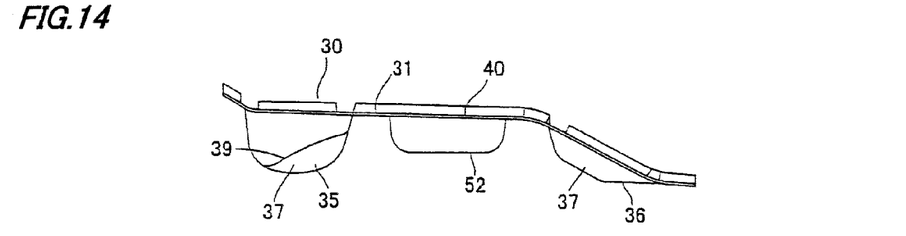
[FIG. 14] is a plan illustrative view schematically showing the fourth embodiment of a substrate storage container according to the present invention.
Figure 15:
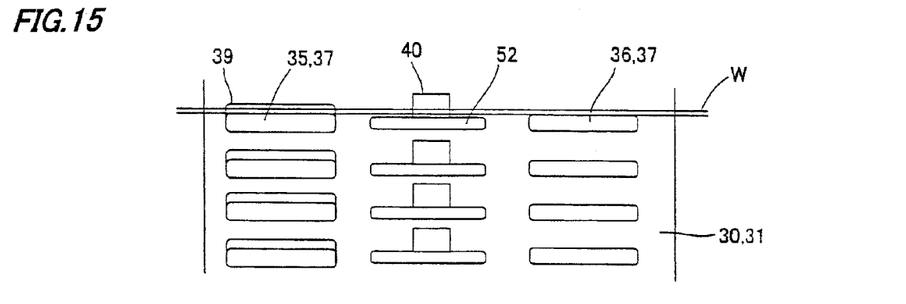
[FIG. 15] is a sectional illustrative view schematically showing the fourth embodiment of a substrate storage container according to the present invention.

Next, FIGS. 14 and 15 show the fourth embodiment of the present invention. In this case, a plate-like shelf 52 is formed horizontally between, and apart from, first and second supporting parts 35 and 36 as supporting piece 34 of each supporting structure 30.

Shelf 52 is molded of a predetermined molding material, and formed with its top formed at the same height of the surface of first and second supporting parts 35 and 36, or lower than the height of the surface of first and second supporting parts 35 and 36. If the same operational effect as that of the first and second supporting parts 35 and 36 is wanted, contact layer 37 of the second molding material is laminated over at least the top surface of the exposed area. The molding material of this shelf 52 is not particularly limited, but the first molding material is selected if contact with substrate W is wanted to avoid.

The bottom side or the undersurface of shelf 52 is positioned higher than the undersurface of first and second supporting parts 35 and 36 in order to avoid the pickup range narrowing when substrate W is picked up by automaton. Other portions are the same as in the above embodiment, so that description is omitted.

Also in the present embodiment, the same operational effect as in the above embodiment can be expected. In addition, it is obvious that when substrate W is inserted into container body 10 not automatically but manually, a wrong insertion of the substrate into adjacent supporting piece 34 (cross-slot) can be inhibited by shelf 52.

Figure 16:
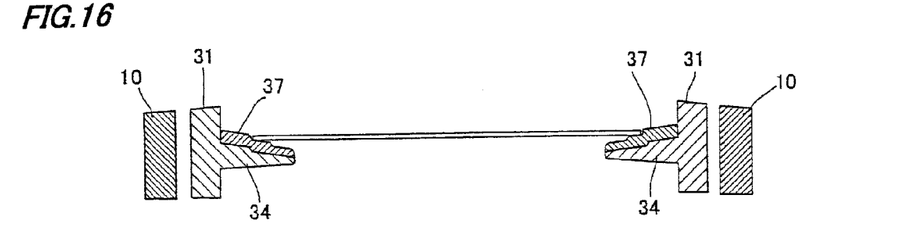
[FIG. 16] is a sectional illustrative view schematically showing the fifth embodiment of a substrate storage container according to the present invention.

Next, FIG. 16 shows the fifth embodiment of the present invention. In this case, contact layer 37 is laminated over only the top surface of first and second supporting parts 35 and 36 as supporting piece 34 of each supporting structure 30. Other portions are the same as in the above embodiment, so that description is omitted.

Also, in the present embodiment, the same operational effect as in the above embodiment can be expected. In addition, since of the exposed areas of first and second supporting parts 35 and 36, contact layer 37 is laminated over at least the top surface, it is possible to reduce the lamination area of contact layer 37, hence cut down the cost.

Figure 17:
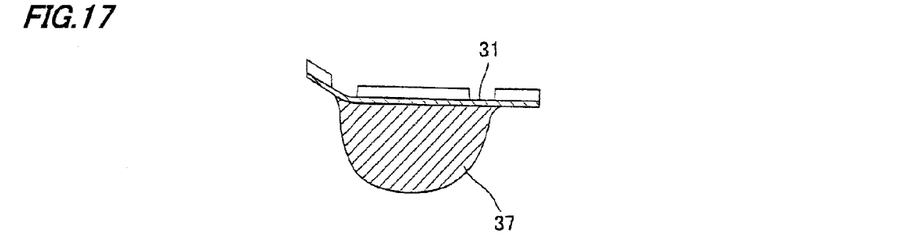
[FIG. 17] is a plan illustrative view schematically showing the sixth embodiment of a substrate storage container according to the present invention.
Figure 18:
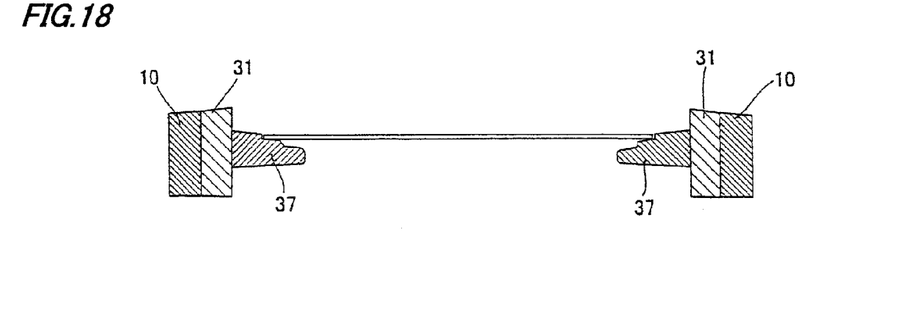
[FIG. 18] is a sectional illustrative view schematically showing the sixth embodiment of a substrate storage container according to the present invention.

Next, FIGS. 17 and 18 show the sixth embodiment of the present invention. In this case, instead of molding supporting piece 34 of each supporting structure 30 with the first molding material, supporting piece 34 of each supporting structure 30 and contact layer 37 are molded of the second molding material and integrated so that each supporting piece 34 supports substrate W.

The peripheral portion of boundary 6 between supporting wall 31 and supporting piece 34 is formed with tapering thin projected piece 5 in view of securing strength, and the tapering inclined angle θ of each thin projected piece 5 is specified to range from 5° to 40°, preferably 10° to 30°, and more preferably 15° to 20° while the length L of inclined surface 7 forming boundary 6 is specified to range from 0.4 to 5.0 mm. Other portions are the same as in the above embodiment, so that description is omitted.

Also in the present embodiment, the same operational effect as in the above embodiment can be expected. In addition, it is possible to expect to diversify the production method and configuration.

The process of the multicolor molding method of the above embodiments can be modified as follows. For example, the plasticized first molding material is charged into a mold so as to form first molding part 1 by injection molding. The mold is opened once and the turntable of the mold is rotated 180° while the first molding part 1 remains attached to the core side of the mold. The mold is closed and then filled with the plasticized second molding material so as to form second molding part 3 while at least part of the peripheral portions of boundaries 6 between first and second molding parts 1 and 3 is formed with thin projected pieces 5 to fuse and integrate them so as to produce a multicolor molding article having patterns of design characters, numerals, symbols and the like after dismounting.

Other than the methods of multicolor molding using the dedicated machine inducing the above two sets of injectors, for example a method of performing multicolor molding by attaching two sets of molds back to back around a vertical shaft and turning half a rotation about the vertical shaft, or a method of performing multicolor molding by placing sets of a cavity and core for the first molding and the second molding in a single mold set may be adopted as appropriate. Further, this multicolor molding method is further developed so as to increase the number of cylinders for forming molding articles and perform molding of some colors.

Also, in the above embodiments, linear boundaries 6 between first and second molding parts 1 and 3 were shown, but the boundary is not particularly limited to this. A wavy, triangular, rectangular, jagged, stepped, saw-toothed or other shaped boundary 6 may be used to increase the contact area and thereby obtain good joining. Further, though a substrate storage container of a front open box type was illustrated, but the substrate storage container is not particularly limited to this. For example, a substrate storage container of an open cassette having a top opening is also permitted. Moreover, as long as no hindrance occurs, supporting piece 34 may be formed as a flat plate having an approximately open V-shape when viewed from top, instead of being divided into first and second supporting parts 35 and 36.

Also, though the peripheral portion of boundary 6 between each supporting piece 34 and contact layer 37 is formed with tapering thin projected piece 5, the configuration is not particularly limited to this. For example, at least part of the peripheral portion of boundary 6 between an arbitrary supporting piece 34 and contact layer 37 may be formed with tapering thin projected piece 5. Further, though supporting walls 31 are integrated with both the side walls of container body 10 by molding, supporting walls 31 may be integrated to the interior surface of the both side walls of container body 10 by fasteners such as screws, bolts, nuts and the like, or may be fixed by thermal welding, ultrasonic welding, laser welding or the like. It is also possible to fix supporting walls 31 to container body 10 or the bottom plate at its bottom by using concave-convex fitting or any other technique.

Further, when container body 10 is molded of the first molding material, first and second supporting parts 35 and 36 may be directly projected from the interior surface of the side walls of container body 10 instead of being formed from supporting walls 31, and the peripheral portions of boundaries 6 of first and second supporting parts 35 and 36 with contact layer 37 may be each formed with tapering thin projected piece 5, wherein its tapering inclined angle θ is specified within 5° to 40° while the length L of inclined surface 7 is set to range from 0.4 to 5.0 mm. Also, first supporting part 35 may be formed of a combined shape of an approximate triangle and an approximate semicircle when viewed from top.

The invention claimed is:

1. A substrate storage container of a front open box type including supporting structures that are disposed on two sides inside a container body for storing substrates and support substrates in array, each supporting structure being formed of a multicolor molding article
    wherein the supporting structure includes a supporting wall of a first molding material and positioned on an inner side in the container body,
        a supporting piece formed of the first molding material and supported on the supporting wall, and
        a contact layer formed of a second molding material and integrally laminated over a part of the supporting wall and the supporting piece to come in contact with the substrate;
    wherein the first molding material comprises polycarbonate, cycloolefin polymer, or polyether imide;
    wherein the second molding material comprises polybutylene terephthalate, polypropylene, polyethylene, polyethylene terephthalate, polyacetal, or polyether etherketone;
    wherein peripheral portions of boundaries between a part of the supporting wall and the contact layer, and between the supporting piece and the contact layer are formed with in approximately triangular sections with tapering thin projected pieces, respectively, the tapering inclined angle of the thin projected pieces being specified to range from 5° to 40°; and
    wherein the thin projected pieces are formed to have their inclined surfaces specified to be 0.4 to 5.0 mm in length.

2. The substrate storage container according to claim 1, wherein the supporting structure is formed of the first molding material, arranged on the inner side in the container body, and includes a supporting wall for supporting the supporting pieces.

3. The substrate storage container according to claim 2, wherein an interposed layer made of a material different from the second molding material is formed between the inner side in the container body and the supporting wall of the supporting structure.

4. The substrate storage container according to claim 2, wherein the supporting structure includes the contact layer of the second molding material that is layered over the supporting wall and comes in contact with the substrate at the portion closest to the supporting wall.

5. The substrate storage container according to claim 1, wherein a projection that is in contact with the substrate is formed on the top surface of the contact layer laminated on the supporting piece of the supporting structure.

6. The substrate storage container according to claim 1, wherein the supporting piece of the supporting structure includes a first supporting part that is projected inwards from the inner side in the container body and opposes the side portion of the substrate at a position close to the front end and a second supporting part that is projected inwards from the inner side in the container body and opposes the side portion of the substrate at a position close to the rear end, and the contact layer is formed over at least the top surface of the exposed areas of the first and second supporting parts.

7. The substrate storage container according to claim 2, wherein the supporting piece of the supporting structure includes a first supporting part that is projected inwards from the supporting wall and opposes the side portion of the substrate at a position close to the front end and a second supporting part that is projected inwards from the supporting wall and opposes the side portion of the substrate at a position close to the rear end, and the contact layer is formed over the exposed areas of the first and second supporting parts while a contact layer is laminated between the supporting wall and the second supporting part, and, at least part of the peripheral portion of the boundary between the supporting wall and the contact layer is formed with a tapering thin projected piece, the tapering inclined angle of the thin projected piece being specified to range from 5° to 40°.

8. The substrate storage container according claim 6, wherein a shelf is interposed between the first and second supporting parts of the supporting structure.

9. The substrate storage container according to claim 6, wherein the top surface of the contact layer laminated on the exposed areas of the first and second supporting parts is inclined so as to render a circular cone having a center that is approximately concentric with the substrate.

10. The substrate storage container according to claim 4, wherein at least part of the peripheral portion of the boundary between the supporting wall and the contact layer is formed with a tapering thin projected piece, the tapering inclined angle of the thin projected piece being specified to range from 5° to 40°.

11. The substrate storage container according to claim 3, wherein the supporting structure includes the contact layer of the second molding material that is layered over the supporting wall and comes in contact with the substrate at the portion closest to the supporting wall.

12. The substrate storage container according to claim 2, wherein a projection that is in contact with the substrate is formed on the top surface of the contact layer laminated on the supporting piece of the supporting structure.

\* \* \* \* \*